United States Patent [19]

Chao et al.

[11] Patent Number: 5,029,386

[45] Date of Patent: Jul. 9, 1991

[54] HIERARCHICAL TAPE AUTOMATED BONDING METHOD

[75] Inventors: Clinton C. Chao, Redwood City; Kim K. H. Chen, Fremont; Jacques Leibovitz, San Jose; Edith P. Prather, Redwood City, all of Calif.

[73] Assignee: Hewlett-Packard Company, Palo Alto, Calif.

[21] Appl. No.: 583,625

[22] Filed: Sep. 17, 1990

[51] Int. Cl.$^5$ .............................................. H01R 43/00
[52] U.S. Cl. ........................................ 29/827; 228/19; 357/70
[58] Field of Search .................... 206/330; 29/827; 437/217, 220; 228/19, 191, 264

[56] References Cited

U.S. PATENT DOCUMENTS

| | | | |
|---|---|---|---|
| 3,430,835 | 3/1969 | Grable et al. | 228/19 X |
| 4,312,926 | 1/1982 | Burns | 357/70 X |
| 4,616,412 | 10/1986 | Schroeder | 29/827 |
| 4,756,080 | 7/1988 | Thorp, Jr. et al. | 29/827 |
| 4,763,409 | 8/1988 | Takekawa et al. | 29/827 |
| 4,934,582 | 6/1990 | Bertram et al. | 228/19 X |

Primary Examiner—Carl J. Arbes

[57] ABSTRACT

A system and method of interconnecting a first tape automated bonding frame to a substrate so as to facilitate replacement by a second automated bonding frame. The automated bonding frame is formed to include a plurality of signal leads having a pattern of outer lead ends. A semiconductor chip is attached to the inner lead ends of the frame. Connection sites are formed on the substrate to correspond to the pattern of outer lead ends. The substrate bonds of the connection sites to the substrate have a first bonding strength. The outer lead ends are then attached to the connection sites to achieve a second bonding strength less than the first bonding strength. Thus, an application of force on the outer lead ends tends to separate the outer lead ends from the connection sites while leaving the substrate bonds intact. Preferably, the tensile strength of the signal leads is less than both of the above-described bonding strengths. In this manner, the signal leads can be broken prior to peeling of the outer lead ends from the connection sites of the substrate.

13 Claims, 3 Drawing Sheets

HIERARCHICAL TAPE AUTOMATED BONDING METHOD

TECHNICAL FIELD

The present invention relates generally to tape automated bonding and particularly to repair of circuitry interconnected by tape automated bonding.

BACKGROUND ART

In the electronics industry, ever-present goals are to miniaturize integrated circuit chip packaging and to minimize the lengths of interconnections between chips. Multi-chip modules were designed to address these goals. Multi-chip modules package and interconnect a plurality of chips in a functional relationship. The advantages of multi-chip modules are primarily in terms of packaging density and operational speed. The main disadvantage involves the cost of manufacturing such modules.

Among the reasons for the high cost of multi-chip modules is the relatively low manufacturing yield of the modules. As the number of integrated circuit chips within a package increases, the likelihood of a defect within the package also increases. Typically, testing of the individual chips prior to interconnection within a multi-chip module is not possible. Later detection of a defective chip within a module may result in the entire module having to be discarded.

An interconnection technique which permits pretesting of chips is referred to as "tape automated bonding". This fabrication procedure utilizes a continuous insulated tape which is similar to photographic film to provide a planar substrate for chips that are attached to individual sections, or frames, of the tape. A spiderlike metal pattern of conductive traces is etched on each frame. The traces may either "fan out", i.e. radiate from the center of the frame to the four edges, or may be four sets of parallel lines, with each set extending perpendicularly from one edge of a chip. The chip is carefully aligned over the center of the frame so that the contacts of the chip are precisely located at corresponding conductive traces in the central portion of the frame. The chip is then attached to the tape automated bonding frame. This connection of the chip contacts to the inner portion of the frame is referred to as "inner lead bonding".

After the inner lead bonding has been performed, the integrated circuit chip may be tested. The chip can be thoroughly exercised electrically. Following testing, the outer leads of the frame are microbonded to pads on a substrate. The attachment of the conductive traces of the frame to the pads of the substrate is referred to as "outer lead bonding." The substrate is that portion of the multi-chip module which permits mounting of more than one lead frame for electrical communication between the chips supported by the frame.

While tape automated bonding provides an important improvement in the interconnection of integrated circuit chips because it allows pretesting of chips, rework and repair of a circuit having a number of chips is still problematic. A chip having a size less than onehalf inch in length may have more than 400 connection sites. Removal of a single chip from a larger circuit typically requires disconnection of each of the more than 400 outer leads from the substrate connection sites. Desoldering of the lead frame from the substrate connection sites can be a labor-intensive task.

U.S. Pat. No. 4,806,503 to Yoshida et al. teaches a method of replacing integrated circuit chips interconnected within a multi-chip module by use of tape automated bonding. The method of Yoshida et al. is to cut the conductive traces of the lead frame at the centers of the conductive traces. That is, the outer lead bonds are left intact to support the outer portions of the conductive traces. A replacement part having a lead frame with conductive traces sufficiently long to overlap the conductive traces left from the first-installed lead frame is then precisely aligned to allow bonding of the second lead frame to the conductive traces of the original lead frame. While the Yoshida et al. method does permit replacement of chips within a multi-chip module, the method requires a second set of microbonds. To minimize resistivity, it is preferred that the number of microbonds be minimized. Moreover, while bonding devices exist to secure lead frames to substrates, these bonding devices may not be dimensionally or functionally adaptable to microbond a first lead frame to a second lead frame.

It is an object of the present invention to provide a system and method for interconnecting electronic devices wherein the system and method allow testing of devices prior to final mounting and wherein the resulting assembly can be easily reworked or can be removed in its entirety.

SUMMARY OF THE INVENTION

The above object has been met by interconnecting an electronic device to a substrate, such as a circuit board, using a hierarchy of bonding and tensile strengths to allow "cold" removal of solder connections without jeopardizing further use of the substrate. For example, where thermocompression is used to bond outer lead ends of a tape automated bonding frame to connection sites of the substrate, the parameters of force, temperature and time are manipulated to insure that the bonding strength of the outer lead ends to the connection sites is less than the bonding strength of the connection sites to the substrate.

An electronic device, typically an integrated circuit chip, having a plurality of first connection sites is aligned with inner lead ends of the tape automated bonding frame. The inner lead ends and the first connection sites are then bonded. The resulting assembly of the chip and the lead frame can be used for testing of the chip.

If the test results are positive, the outer lead ends of the lead frame are aligned with second connection sites on a substrate. The substrate may be the packaging of a multi-chip module or may be a printed circuit board. The attachment of the second connection sites to the substrate has a first bond strength ($B^1$). The outer lead ends are then attached to the second connections sites using a technique which limits the bond strength ($B^2$) of the outer lead ends to the second connection sites so that $B^1 > B^2$.

An advantage of the present invention is that the integrated circuit chip and its associated lead frame can be easily replaced if the chip is later found to be defective. A force applied to the outer lead ends of the lead frame has the tendency of separating the outer lead ends from the second connection sites while leaving the bonds to the substrate intact. Consequently, it is not necessary to individually desolder the outer lead ends from the second connection sites.

Preferably, the tensile strength ($B^3$) of the individual leads of the tape automated bonding frame is exceeded by both the bond strength ($B^1$) of the connection sites to the substrate and the bond strength ($B^2$) of the connection sites to the outer lead ends. The relationships would then be $B^1 > B^2 > B^3$. Forcing the lead frame from the substrate would cause breaking of the individual leads of the lead frame, whereafter the outer lead ends could be peeled from the second connection sites without harm to the substrate. In a preferred embodiment, the leads are structurally weakened to control the location of the break. This structural weakness may be manufactured into the tape automated bonding frame or may be accomplished immediately prior to removal of the frame by scoring the leads. Alternatively, the leads may be cut at the desired location at the time of removal.

BEST MODE FOR CARRYING OUT THE INVENTION

Figure 1:
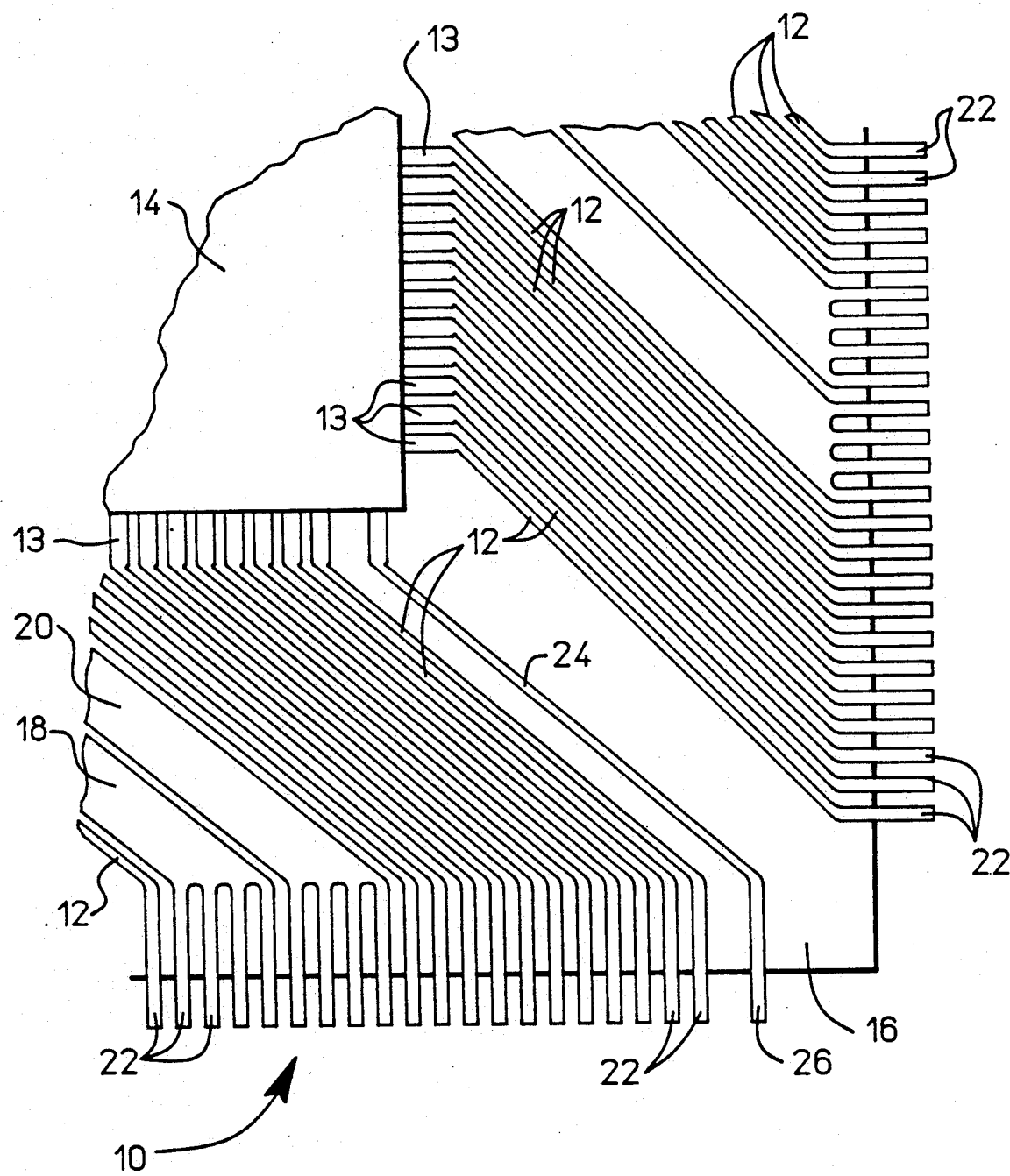
FIG. 1 is a top view of a portion of a tape automated bonding frame having an integrated circuit chip attached thereto.

With reference to FIG. 1, a tape automated bonding frame 10 is shown as having a plurality of conductive traces 12 or fingers which attach at inner leads 13 to a semiconductor chip 14. An exemplary configuration would be a semiconductor chip 14 having 408 connection sites, with each of the conductive fingers 12 attached to one of the sites. The conductive fingers are simultaneously bonded by thermocompression or gold-tin eutectic methods to bumps on a chip 14. The bumps on the chip are gold bumps deposited on aluminum pads to insure a good surface for thermocompression bonding. This "inner lead bonding" method, however, is not critical to the present invention.

Likewise, the "fan out" configuration of conductive fingers 12 radiating from the chip 14 is not critical. The fingers may alternatively be parallel traces extending perpendicularly from the chip. The fingers are spaced together so closely that the center-to-center distance, or pitch, of two fingers may be 4 mils.

The conductive fingers 12 are formed from a copper foil. A portion of the copper is etched away using techniques known in the art. The etching forms the electrically isolated conductive fingers. For utility planes, the etching process may leave a larger area of copper, as shown at 18 and 20. For example, plane 18 may be at ground potential and plane 20 may be at a potential per fingers 12 are preferably nickel plated and covered with a coating of gold.

An insulative tape 16 is used to support the fragile conductive fingers 12. The insulative tape is a polymer having a hole at its center for mounting of the semiconductor chip 14. The center hole allows space for the inner lead bonding.

The resulting assembly of the chip 14 and the tape automated bonding frame 10 is essentially a space transformer to afford testing of the chip 14 and, after testing, interconnection with a second chip. The chip device can be thoroughly exercised electrically or may be burned-in before assembly. This testing is not possible in many other fabrication procedures. Typically, prior to testing the fingers extend beyond what is shown in FIG. 1. If the results of testing are positive, the fingers are cut to a shorter length for connection to outside circuitry. This allows testing apparatus to contact the fingers without affecting the integrity of a later bond.

As shown in FIG. 1, the fingers 12 have portions which extend beyond the insulative tape 16. These portions 22 are referred to in the art as "outer leads." For the purpose of describing the present invention, one conductive finger 24, with its outer lead 26, is illustrated as being spaced apart from the remainder of the fingers 12.

Figure 2:
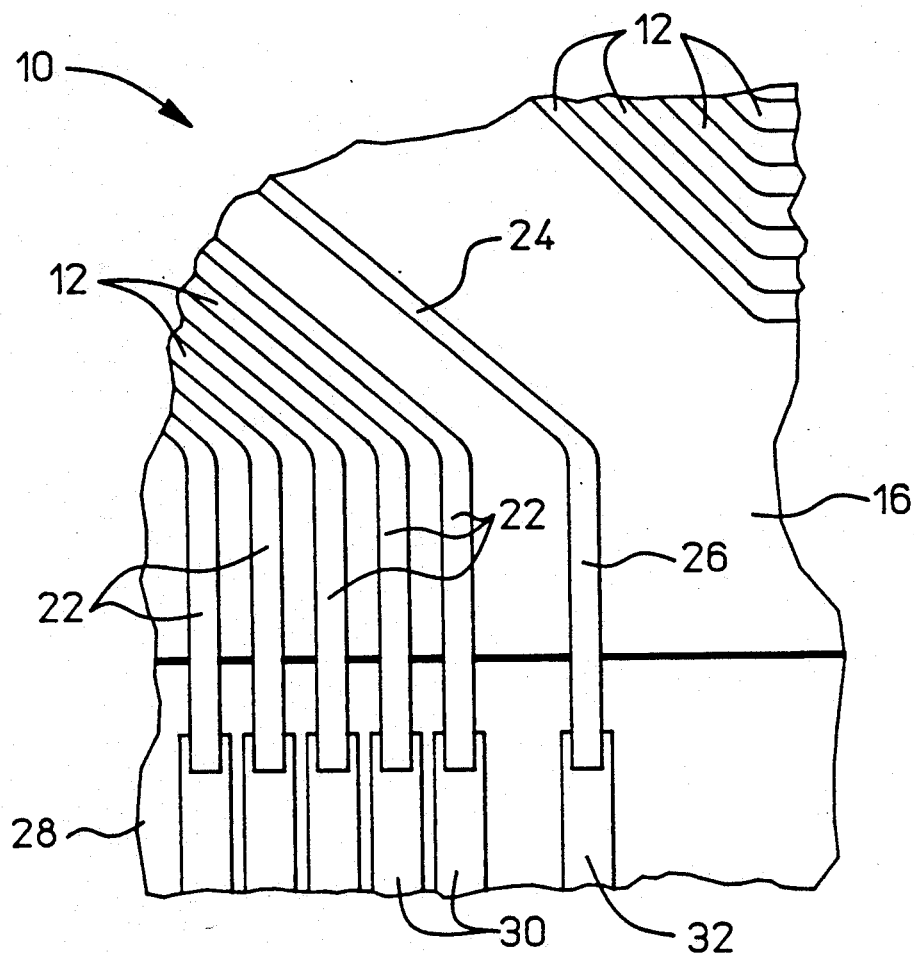
FIG. 2 is a top view of the tape automated bonding frame of FIG. 1 attached to a substrate.

Referring now to FIG. 2, a properly functioning semiconductor chip is interconnected with other circuitry by attachment of the outer leads 22 and 26 of the fingers 12 and 24. The tape automated bonding frame 10 is mounted to a substrate 28 in a manner such that the outer leads are aligned with substrate traces 30 and 32. The substrate traces 30 and 32 act as connection sites for attachment to the outer leads. Alignment of the outer leads 22 and 26 is followed by bonding of the outer leads to the substrate traces 30 and 32. The attachment may be by any one of the techniques of thermocompression bonding, ultrasonic bonding or thermosonic bonding. The problem which is experienced in the art is one of reworking or replacing the semiconductor chip after the microbonding. Removal of the chip from the substrate 28 may require disconnection of more than 400 outer leads 22 and 26 from the connection sites of the substrate traces 30 and 32. Even after removal, the task of replacing a chip is a laborious one since each connection site on the substrate must be cleaned and prepared for connection to a replacement chip and tape automated bonding frame.

Figure 3:
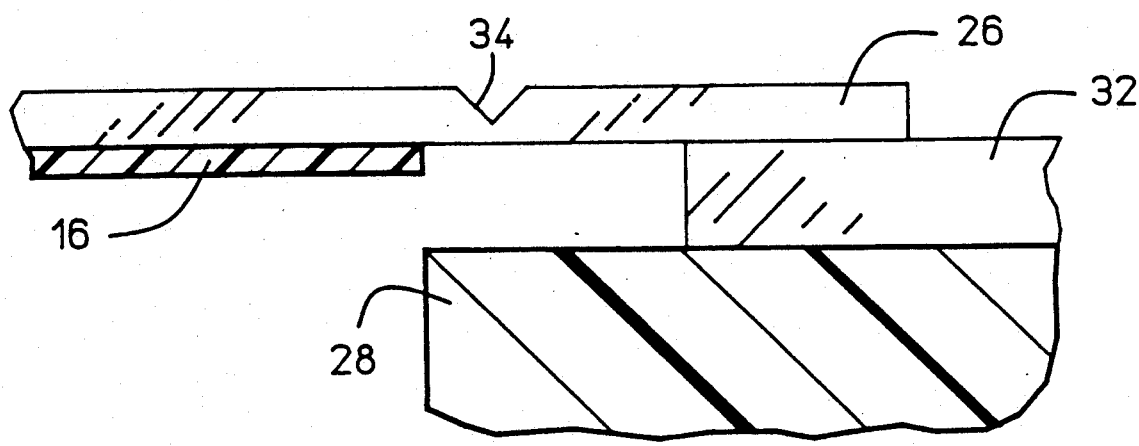
FIGS. 3-6 are side sectional views of a method of replacing the tape automated bonding frame of FIG. 2.

The present invention overcomes the problem of reworking a tape automated bonding frame 10 or replacing a defective semiconductor chip 14 by providing a hierarchy of bonding and tensile strengths. With reference to FIG. 3, a substrate trace 32 is a metallic member which is photolithographically patterned and etched on the substrate 28. The substrate 28 is a package of a multi-chip module. However, this is not critical. Alternatively, the substrate may be a standard printed circuit board or part of a single-chip package. The attachment of the substrate trace 32 to the substrate 28 defines a first bond strength.

As noted above, the outer lead 26 is attached to the substrate trace 32 by any one of the techniques of thermocompression bonding, ultrasonic bonding or thermal sonic bonding. The attachment provides a second bonding strength. In attaching the outer lead, the relevant parameters are controlled so that the second bonding strength is less than the first bonding strength of the trace 32 to the substrate 28. Thus, a force applied to the outer lead 26 in a direction away from the substrate 28 will overcome the bonding strength of the outer lead to the substrate trace 32, while leaving intact the bond of the trace 32 to the substrate. In this manner, the tape automated bonding frame 10 of FIG. 2 can be removed from the substrate 28 without application of a solder tip. Instead, the outer leads are peeled away from the substrate.

As shown in FIG. 2, the width of the conductive fingers 12 and 24 increases at the outer leads 22 and 26 of the conductive fingers. Preferably, the tensile strength of the conductive fingers at the start of the outer leads is less than the bonding strength of the outer leads to the substrate traces 30 and 32. Removal of a tape automated bonding frame 10 then becomes a two-step process. The first step is to apply force to the tape automated bonding frame in a direction away from the substrate 28. This first step causes breakage of the conductive fingers, leaving only the outer leads still attached to the substrate traces. The second step is to peel the outer leads away from the substrate traces. A replacement tape automated bonding frame 10 can then be attached to the substrate traces.

Figure 4:
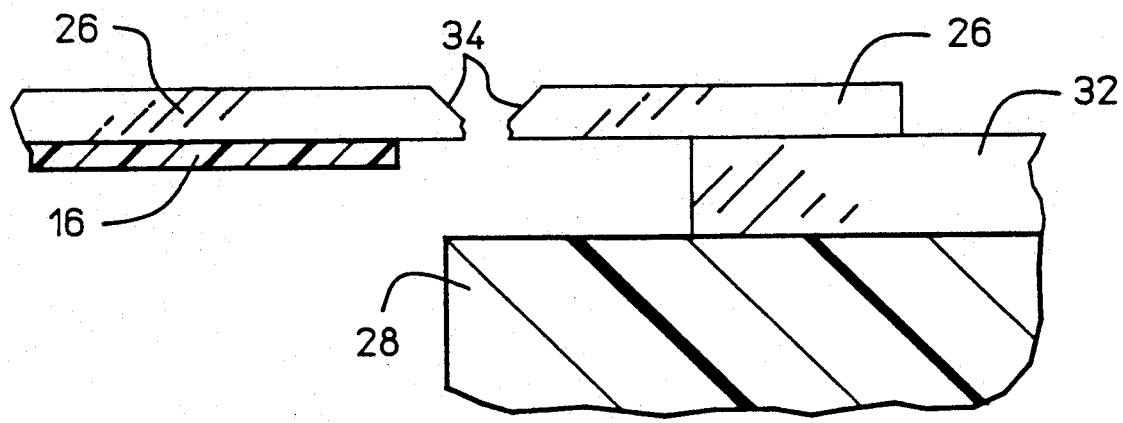
Figure 5:
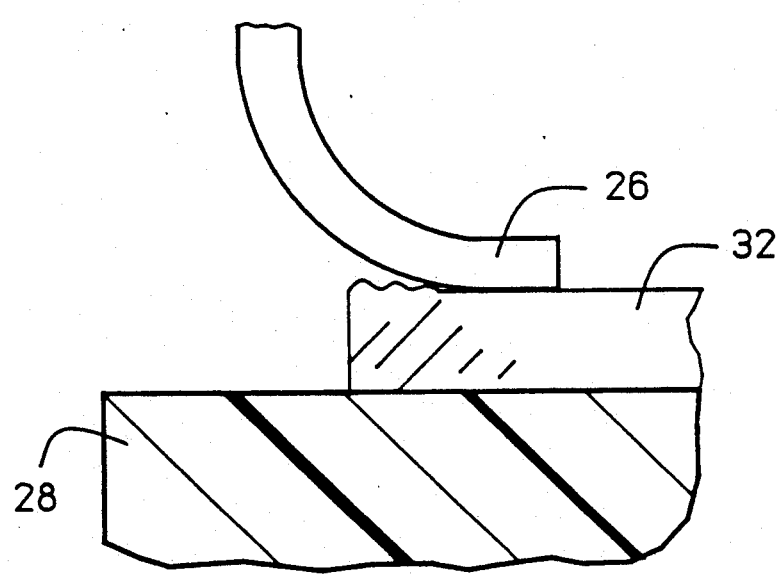

Alternatively, breaking of a conductive finger can be controlled by structurally weakening the conductive finger at the desired location of breakage. Referring again to FIG. 3, the outer lead 26 is shown as including a score 34 which may be a manufacturing score or may be provided by the person removing the lead frame. The outer lead 26 can then be broken along the scores in the outer leads so as to remove a defective semiconductor chip. This is shown in FIG. 4. Peeling of the remainder of the outer lead 26 from the substrate trace 32 is illustrated in FIG. 5. The substrate trace remains firmly bonded to the substrate 28.

Figure 6:
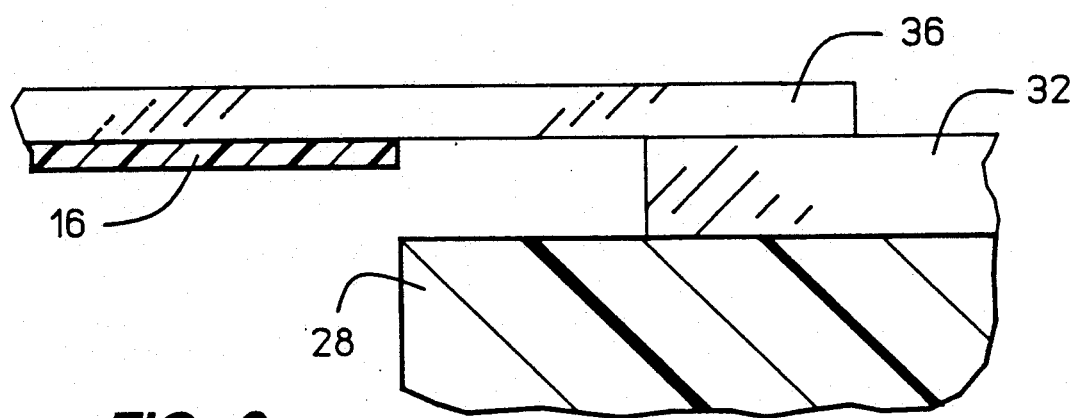

After removal of the defective semiconductor chip or tape automated bonding frame, a replacement is attached to the same substrate traces. As shown in FIG. 6, a replacement outer lead 36 is bonded to the substrate trace 32. Again, the bonding strength of the outer lead to the substrate trace is less than the bonding strength of the substrate trace to the substrate 28.

EXAMPLE

Still referring to FIG. 6, the preferred embodiment is described above as a package 28 of a multi-chip module having a metallic substrate trace 32 photolithographically patterned and etched thereon, and a nickel-plated, gold-coated copper finger 36 of a tape automated bonding frame. In using thermocompression bonding at a temperature of 500° C. and a dwell time of 1 second, it was discovered that a force of 500 grams was insufficient in providing the necessary bonding strength. At the opposite extreme, a force of 2,000 grams at the same temperature and same dwell time provided a greater bonding strength than that of the substrate trace 32 to the substrate 28. However, a force in the range of 1,000 grams to 1,500 grams provided a bonding strength greater than the tensile strength of the conductive finger but less than the bonding strength of the substrate trace 32 to the substrate 28. This range of force was successful with an embodiment in which both the outer leads and the substrate traces were 10 mils in width and had a 10 mils pitch. The successful range will differ with the dimensions of the components and with the temperature and the dwell time used in the thermocompression bonding.

We claim:

1. A method of connecting a first automated bonding frame to a substrate to facilitate replacement by a second frame comprising,
   forming an automated bonding frame having a plurality of signal leads, said signal leads having a first pattern of outer lead ends,
   forming a second pattern of connection sites on a substrate in a manner such that each connection site has a first bonding strength to said substrate, said second pattern corresponding to said first pattern, and
   bonding said first pattern of outer lead ends to said second pattern of connection sites to achieve a second bonding strength, said first bonding strength exceeding said second bonding strength, whereby the application of sufficient force on said outer lead ends overcome said second bonding strength while leaving said connection sites intact on said substrate.

2. The method of claim 1 wherein said step of bonding said first pattern to said second pattern is a step utilizing thermocompression in predetermined ranges of temperature, time and force to achieve said second bonding strength.

3. The method of claim 1 wherein said forming of said automated bonding frame includes choosing materials in dimensions such that said signal leads each have a tensile strength less than said first and second bonding strength, whereby application of force on said signal leads tends to break said signal leads.

4. The system of claim 3 wherein said forming of said tape automated bonding frame includes choosing dimensions of said signal leads to provide flared regions at said outer lead ends, thereby promoting breaking immediately adjacent said flared regions.

5. The method of claim 3 further comprising the step of providing structurally weakened regions on said signal leads, said step promoting breaking at said structurally weakened regions.

6. The method of claim 5 wherein said step of providing structurally weakened regions is a scoring of said signal leads.

7. The method of claim 1 wherein said signal leads are formed of copper.

8. A method of connecting a first automated bonding frame to a substrate to facilitate replacement by a second frame comprising,
   providing an automated bonding frame having a plurality of outwardly extending metallic signal leads, said signal leads having inner lead ends and outer lead ends,
   attaching an electronic component to said inner lead ends,
   providing a substrate having a plurality of connection sites bonded onto a first surface of said substrate, said connection sites being bonded within an upper range of bonding strengths, and
   attaching said outer lead ends to said connection sites at a lower range of bonding strengths, whereby a force applied to an outer lead end has a tendency of separating said outer lead ends from said connection sites while leaving said connection sites bonded to said substrate.

9. The method of claim 8 further comprising a step of forming said signal leads of materials and dimensions such that said signal leads have a tensile strength less than the bond strength of said attachment of said outer lead ends to said connection sites.

10. The method of claim 9 wherein said step of forming said signal leads includes increasing the width of said signal leads at said outer lead ends.

11. The method of claim 8 wherein said step of attaching said outer lead ends is a step using thermocompression bonding.

12. The method of claim 9 wherein said step of forming said signal leads includes choosing copper.

13. The method of claim 8 further comprising the step of structurally weakening said signal leads at regions to promote breaking of said signal leads at said regions upon application of force to said signal leads.

* * * * *